US008280663B2

(12) United States Patent
Artiles Albelda et al.

(10) Patent No.: US 8,280,663 B2
(45) Date of Patent: Oct. 2, 2012

(54) METHODS AND SYSTEMS FOR ASSISTING IN THE DESIGN OF MOBILE SURFACES OF OBJECTS

(75) Inventors: Carlos Artiles Albelda, Madrid (ES); David Perdones Díaz, Madrid (ES); Valentín De Pablo Fouce, Madrid (ES)

(73) Assignee: Airbus Operations S.L., Madrid (ES)

( * ) Notice: Subject to any disclaimer, the term of this patent is extended or adjusted under 35 U.S.C. 154(b) by 0 days.

(21) Appl. No.: 12/006,259

(22) Filed: Dec. 31, 2007

(65) Prior Publication Data

US 2009/0112502 A1    Apr. 30, 2009

(30) Foreign Application Priority Data

Oct. 31, 2007  (ES) .................... 200702872

(51) Int. Cl.
*G01C 17/38* (2006.01)
*G06G 7/48* (2006.01)
(52) U.S. Cl. ............................. 702/94; 703/8
(58) Field of Classification Search .................. 702/94, 702/85, 95, 97, 105, 144, 149–153, 182, 702/155–158, 33–36, 41–43, 81, 84, 100; 703/1–2, 6–8; 701/3–6; 700/13, 28–32
See application file for complete search history.

(56) References Cited

U.S. PATENT DOCUMENTS

| 6,553,333 B1 * | 4/2003 | Shenk ........................... 702/182 |
| 6,959,269 B1 * | 10/2005 | Welterlen .......................... 703/8 |
| 7,092,845 B2 * | 8/2006 | Keane et al. .................. 702/182 |
| 2007/0219766 A1 * | 9/2007 | Duggleby et al. ................ 703/9 |
| 2008/0140359 A1 * | 6/2008 | Narramore et al. ............... 703/1 |
| 2009/0171634 A1 * | 7/2009 | Bensch et al. .................... 703/2 |

OTHER PUBLICATIONS

S. Mouton, Numerical Investigations of Model Support Interference in Subsonic and Transonic Wind Tunnels, Oct. 17-19, 2007, Office National d'Etudes et de Recherches Aerospatiales (ONERA), 12 pp.*
Arizono et al., Flutter Simulations of a T-tail Configuration Using Non-Linear Aerodynamics, Published Online: Mar. 23, 2007, International Journal for Numerical Methods in Engineering, vol. 72, pp. 1513-1523.*
Lei et al., CFD-Based Aerodynamic Shape Optimization for Japanese Experimental Supersonic Transport, 2004, 24th International Congress of the Aeronautical Science, ICAS 2004, 10 pp.*

(Continued)

*Primary Examiner* — Toan M Le
(74) *Attorney, Agent, or Firm* — Ladas & Parry LLP

(57) ABSTRACT

A computer-aided method suitable for calculating the position of a mobile surface of an object such an aircraft that moves through a fluid medium, which is affected by at least an upstream or downstream object component, for achieving a predetermined value Vo of a predetermined object performance target, including the following steps: preparing a computer-implemented CFD model of the object having said mobile surface in a first position; solving the CFD model and obtaining the value Vi of said object performance target; if the difference between Vi and Vo is greater than a predetermined value, modifying the CFD model changing the position of the mobile surface in the CFD model and iterating the solving step. The invention also refers to a system for carrying out the method.

8 Claims, 1 Drawing Sheet

OTHER PUBLICATIONS

Dwight et al., Effect of Various Approximations of the Discrete Adjoint on Gradient-Based Optimization, Jan. 9-12, 2006, 44th AIAA Aerospace Sciences Meeting and Exhibit, Reno, NV, 22 pp.*

Search Report dated Apr. 3, 2009 in respect of corresponding PCT Application No. PCT/EP2008/064056.

Kroll, N., et al., "Ongoing Activities in Flow Simulation and Shape Optimization Within the German Megadesign Project", $25^{th}$ International Congress of the Aeronautical Sciences, Sep. 2006, pp. 1-16.

* cited by examiner

METHODS AND SYSTEMS FOR ASSISTING IN THE DESIGN OF MOBILE SURFACES OF OBJECTS

FIELD OF THE INVENTION

The present invention refers to methods and systems for assisting in the design of mobile surfaces of objects moving through a fluid medium and more in particular to methods and systems for obtaining an accurate position of mobile surfaces of aircrafts that can be affected by upstream or downstream aircraft components.

BACKGROUND OF THE INVENTION

The performance of aircraft mobile surfaces such as tails, horizontal tail planes, canards, elevators, spoilers, ailerons, flaps, other high lift devices (slats for example) or rudders, is one of the more important issues in global aircraft design.

Aircraft mobile surfaces are used as control surfaces, for example, ailerons are used to control roll, an horizontal tail plane is used to control pitch and a rudder is used to control yaw. Therefore its behaviour defines aircraft control laws and design constrains.

Aircraft mobile surfaces can be affected by other parts of an aircraft (for example they can suffer a loss of upstream dynamic pressure due to effects caused by a component located upstream of the flow) and one of the main problems in a design environment (and also in other fields) is to obtain an accurate position of a mobile surface that can be affected by other components of the aircraft in certain situations.

That position can not be obtained computing the surface as an isolated component, one needs to know the effect that other parts of the airplane (that can be upstream or downstream) have on the mobile surface. In fact, a difficult computation is to be expected when working with mobile surfaces that are strongly affected by the effect of upstream air (for example, a downwash or wakes) of other surfaces on them.

In the known prior art, the behaviour of mobile surfaces affected by other aircraft's components is not computed directly. One of the known techniques involves the computation of the performance of the mobile surface at different positions and the obtention of the position for the required performance by interpolation. Another known technique involves the computation of the behaviour of the mobile surface without the effect of other component and the use of experimental information or theoretical correlations for obtaining the behaviour of the mobile surface completely installed in the aircraft.

Although these known techniques can provide close estimations of the position of a mobile surface, the results obtained do not comply with the current quality requirements of aircraft design, due to, among other reasons, they neglect second order effects and non-lineal behaviour of the flow.

The present invention is intended to solve this drawback.

SUMMARY OF THE INVENTION

It is an object of the present invention to provide methods and systems for calculating an accurate position of a mobile surface of an object that moves through a fluid medium, such as an aircraft, that can be affected by other components of the object.

It is another object of the present invention to provide methods and systems for computing the behaviour of a mobile surface of an object that moves through a fluid medium, such as an aircraft, that can be affected by other components of the aircraft.

In one aspect, these and other objects are met by providing a computer-aided method suitable for calculating the position of a mobile surface of an object that moves through a fluid medium, such as an aircraft, which is affected by at least an upstream or downstream component, for achieving a predetermined value Vo of a predetermined object performance target, comprising the following steps:

Preparing a computer-implemented CFD model of said object having said mobile surface in a first position.

Solving said CFD model and obtaining the value Vi of said object performance target.

If the difference between Vi and Vo is greater than a predetermined value, modifying the CFD model changing the position of the mobile surface in the CFD model and iterating the solving step.

In another aspect, the above-mentioned objects are met by providing a system for calculating the position of a mobile surface of an object that moves through a fluid medium, such as an aircraft, which is affected by at least an upstream or downstream component, for achieving a predetermined value Vo of a predetermined object performance target, comprising:

A computer-implemented 3D discrete model of said object and the surrounding fluid.

A computer-implemented 3D CFD module for calculating said object performance target at different positions of said mobile surface.

Tools for optimizing the iteration of the calculations of said performance target at different positions of said mobile surface to achieve a predetermined value of said object performance target.

In a preferred embodiment of the method according to this invention, the first position of the mobile surface of an aircraft is determined using the information provided by one or more of the following tools: known methods for calculating a predetermined aircraft performance target at a given location; correlations of available information for similar aircrafts; aerodynamic numerical methods. Hereby an optimized method is achieved.

In another preferred embodiment of the method according to this invention the change of position of the mobile surface of an aircraft in each one of said iterations is determined using the information provided by one or more of the following tools: the designer experience; the information provided by the previous CFD solution; aerodynamic numerical methods. Hereby an optimized method is achieved In a preferred embodiment of the method and system according to this invention, the aircraft performance target is one or a combination of the following: a total force on said mobile surface, a total moment on the aircraft, a side force on the aircraft, a reaction on the mobile surface joint or actuator. Hereby a method and system that allows the obtention of high quality information for the aircraft design such as the following:

High quality information for setting certain aircraft control laws. For example, for setting the pitch control law of an aircraft with canard—a mobile surface that can be affected by the wing-, an accurate information regarding the canard deflection for obtaining a predetermined force is needed.

High quality information for the aerodynamic surface design of mobile surfaces when the design point is located at a specific performance point (for example a global force on the surface or a global moment generated by the surface).

High quality information regarding the needed tolerance in the deflection of a mobile surface knowing the maximum and minimum deflection that can be requested in all flight envelopes.

High quality information regarding the deflection of a mobile surface for the design of auxiliary systems such a flight tests instruments located close to said mobile surface.

The method and system according to this invention is particularly applicable to the following mobile surfaces of an aircraft: an horizontal tail plane, a canard, a tail, an elevator, an aileron, a flap, other high lift devices (slats for example), a rudder, a spoiler.

Other characteristics and advantages of the present invention will be clear from the following detailed description of embodiments illustrative of its object in relation to the attached figures.

DETAILED DESCRIPTION OF THE INVENTION

Figure 1:
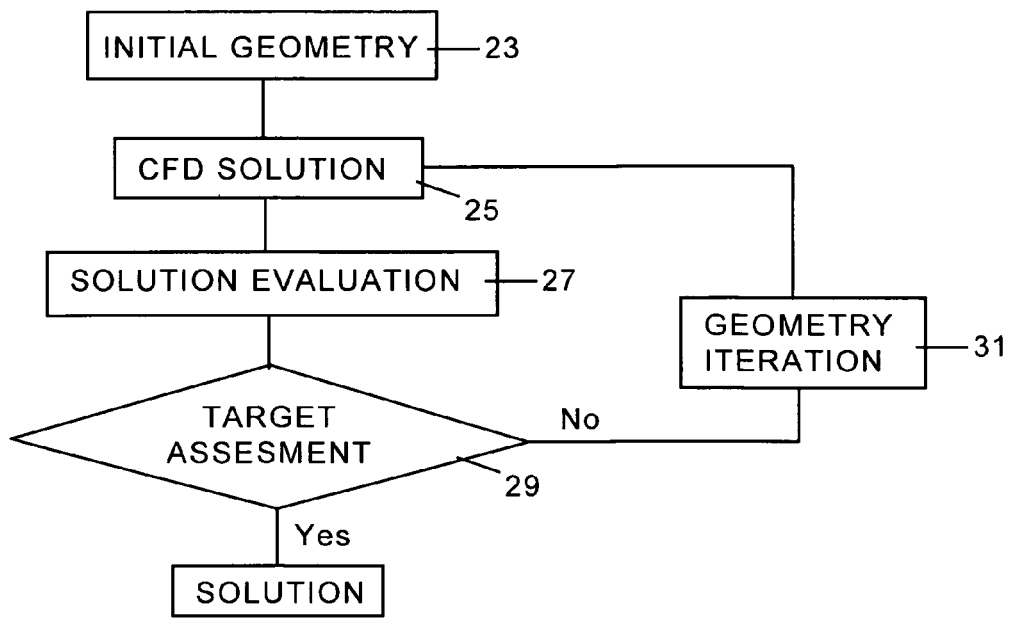
FIG. 1 shows a flow chart illustrating the method of this invention.

Nowadays the design of aircrafts is done using Computational Fluid Dynamics (CFD) and Wind Tunnel Testing (WTT), being a current trend the reduction of tunnel testing and the increase of simulation. The advantages of CFD are significant as they reduce the time needed to know a solution and allow higher iteration in geometry, due to more flexibility on geometry studied, bringing to a more optimized solution.

A CFD computation involves a computer-implemented 3D discrete model of the aircraft and the surrounding fluid and a computer-implemented CFD solver. The discrete model of the aircraft is created using one or more computer programs to develop a mesh dividing aircraft geometry into subdomains for CFD computations and applying material properties and boundary conditions to the geometry. The CFD solver allows carrying out the relevant CFD computations for said discrete model and checking the validity of the solutions obtained.

An embodiment of a method and system according to this invention for obtaining the position of an horizontal tail plane (HTP) of an aircraft for achieving as predetermined aircraft performance target a $C_{LH}$ value of 0.0134 ($C_{LH}$ is the difference between a wing-body tail model and a wing model) will now be described.

The input data for the method are:

A general geometry of the aircraft.

Specific flight conditions. In this embodiment these conditions are the following. Flight angle of attack: 0 deg; Mach number: 0.7. Flight Reynolds: 50 millions. Sideslip angle: 0 deg.

A performance target of the mobile surface in question, i.e. HTP 13: a value Vo=0.0134 of $C_{LH}$.

In the first step 23, the initial geometry of the aircraft 11 with the HTP 13 is defined. This initial geometry consists in the complete geometry of the aircraft 11 with the HTP 13 being located in an initial position.

For defining the initial position of HTP 13 the following known mathematical model for the lift of an HTP is used:

$$C_{LH} = C_{L\alpha}[K_{HTP(B)} + K_{B(HTP)}]\left(1 - \frac{\partial \varepsilon}{\partial \alpha}\right)\frac{q}{q_\infty}\frac{S_e}{S}(\alpha + ih - \alpha_0)$$

where in previous equation $C_{L\alpha}$ is the HTP lift curve slope, $[K_{HTP(B)}+K_{B(HTP)}]$ represent ratios of the HTP lift in presence of the body and the body lift in presence of the HTP, $$\frac{\partial \varepsilon}{\partial \alpha}$$

is the downwash effect due to upstream components (upstream flow of HTP with deflection), q represents total pressure at each point along the HTP and $q_\infty$ is the total pressure upstream of the aircraft, $$\frac{S_e}{S}$$

is a surface relation due to non-dimensional parameters, α is the upstream angle of attack, ih is the setting of HTP and $\alpha_0$ is the 0 lift angle of attack for a specific setting of the HTP.

The value obtained for the position of the HTP 13 is 0.543. Moving the HTP 13 geometry, using as rotating axis the pivot point of the geometry, the initial geometry is created with HTP 13 in a position defined by said value of 0.543.

Figure 2:
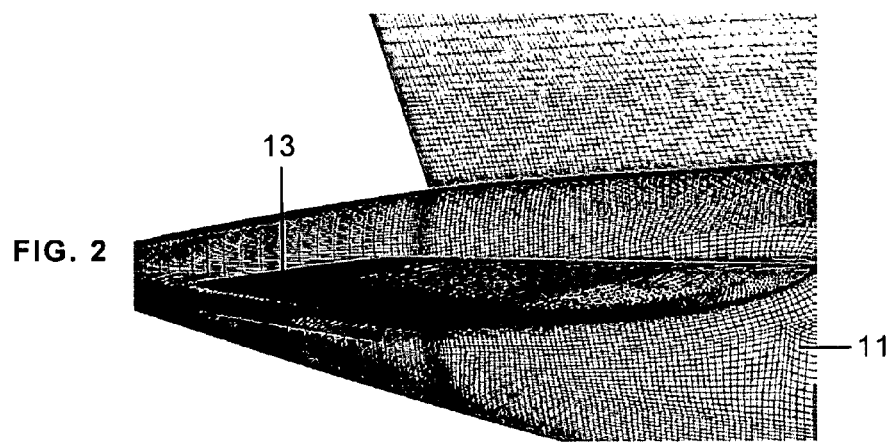
FIG. 2 shows a view of the mesh of an aircraft used in this invention, having the horizontal tail plane in a first position.
Figure 3:
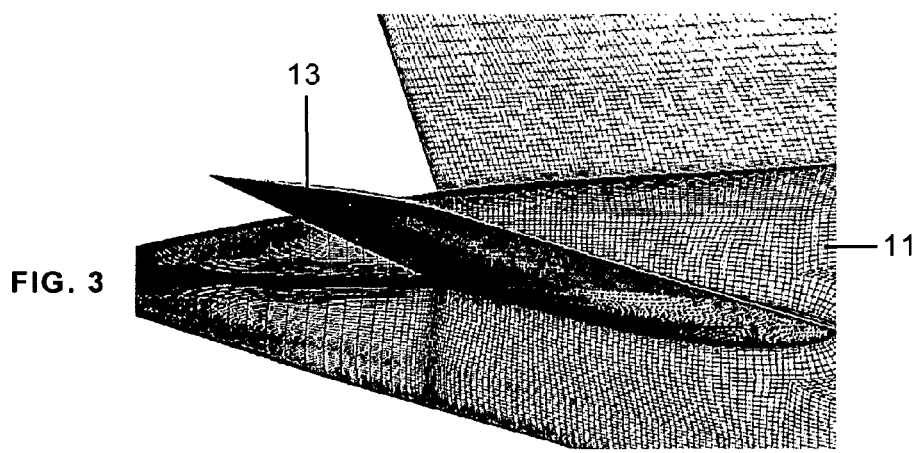
FIG. 3 shows a view of the mesh of an aircraft used in this invention, having the horizontal tail plane in a second position.

In the second step 25 a CFD solution is computed. This step comprises generating a mesh of enough quality for CFD computation (as the meshes shown in FIGS. 2 and 3) using the ICEM Hexa meshing program and performing the CFD computation with CFD code solver elsA to compute the $C_{LH}$ of the HTP 13 (also a tail off mesh was used). The solution obtained is $C_{LH}$=0.0098.

In the third step 27 the solution obtained is evaluated. Apart from CFD quality criteria, aerodynamic criteria (specially of non expected separations) are taken into account to assure the validity of the mesh and the CFD solution. In particular it is checked that the mesh complies with the requirement of a minimum value of 0.15 for the Eriksson Skewness parameter and that the residuals of the solutions were reduced at least two orders of magnitude and that a convergence on HTP load of order 0.0001 is obtained.

Once the quality of the solution has been checked, in step 29 the solution is compared with the performance target. As the solution obtained, $C_{LH}$=0.0098, is far from the target, $C_{LH}$=0.0134, a new iteration must be performed.

In step 31 a new geometry with the HTP 13 in a new position is defined.

For this definition a model with the variation of $C_{LH}$ in function of the HTP 13 position is needed.

In this embodiment the following model is used:

$$C_{LH}=0.0098+C_{LHih}(ih-0.543).$$

To model $C_{LHih}$ different methods can be used.

One of them uses the CFD solution as input, as in step 23.

Another method use the linear theory for wings, where the following equation shall be solved:

$$\sum_1^\infty a_n \sin n\theta = \frac{1}{2}\kappa(\theta)\frac{dc_l}{d\alpha}\left[1 - \frac{1}{2\sin\theta}\sum_1^\infty n a_n \sin n\theta\right]$$

In this equation one can include the effects of the pressure lost obtained from the CFD (in the first equation one can introduce pressure lost and also downwash knowledge). So that the new equation to solve is:

$$\sum_1^\infty a_n \sin n\theta = \frac{1}{2} \frac{q}{q_\infty}(\theta)\kappa(\theta)\frac{dc_l}{d\alpha}\left(\frac{U_e}{U_\infty}\right)\left[1 - \frac{1}{2\sin\theta \frac{U_e}{U_\infty}}\sum_1^\infty n a_n \sin n\theta\right]$$

where in previous equations $\alpha_n$ represents a serial expansion of distributed lift in $\theta$ (where span position is defined by $$y = \frac{b}{2}\cos\theta),$$

q represents total pressure at each point along the HTP and $q_\infty$ is the total pressure upstream of the aircraft, $\kappa(\theta)$ is the non-dimensional chord at each point along HTP's span $$\frac{dc_l}{d\alpha}\left(\frac{U_e}{U_\infty}\right)$$

is the airfoil at each point of the chord behaviour with the incidence based on the actual velocity crossing by the airfoil (based on the CFD solution).

In the previous equation data from CFD are introduced, particularly the pressure lost and the new velocity coming to the HTP due to the effect of the wing on the downwash. It is supposed that the deflection is not highly affected by the HTP setting angle.

With this CFD input on the new model the new HTP 13 position is obtained for the first iteration. The value obtained is 0.726.

Steps 25 and 27 are performed for this new geometry and the solution obtained is $C_{LH}$=0.0128 that is quite close to the solution needed.

For the next iteration we use numerical methods in step 31. Using the secant method to obtain the next HTP 13 position we obtain the value 0.763 and performing steps 25 and 27 for the new geometry the solution obtained is $C_{LH}$=0.0136 that is very close to the solution needed. Depending on the tolerance criteria, new iterations can be carried out.

The main advantage of the methods and systems according to this invention is that they allow obtaining very accurately the position of a mobile surface for achieving a predetermined aircraft performance target. In particular, the combined use of mathematical methods with a CFD solution output allows increasing the accuracy of each iteration step. The results from CFD can be easily adapted to a any suitable mathematical model.

Modifications may be introduced into the preferred embodiment just set forth, which are comprised within the scope defined by the following claims.

The invention claimed is:

1. A computer-aided method for designing aircraft mobile surfaces comprising calculating on a computer the position of said mobile surfaces as it moves through a fluid medium, which is affected by at least an upstream or downstream object component, for achieving a predetermined value Vo of a predetermined object performance target, said calculation including the following steps:

a) preparing a computer-implemented computational fluid dynamics model of said object having said mobile surface in a first position;
b) solving said model and obtaining the value Vi of said object performance target in said first position;
c) if the difference between Vi and Vo is greater than a predetermined value, modifying said model changing the position of the mobile surface in said model and iterating step b)

and applying the results obtained to the design of said aircraft mobile surface and displaying a computer-generated depiction of said aircraft mobile surface designed in accordance with said steps a)-c).

2. The computer-aided method according to claim 1, wherein in step a) the first position of said mobile surface is determined using the information provided by one or more of the following tools: calculation of a predetermined object performance target at a given location; correlation of available information for similar objects; and aerodynamic numerical methods.

3. The computer-aided method according to claim 1, characterized in that in step c) each change of position of said mobile surface is determined using the information provided by one or more of the following tools: the information provided by the previous CFD solution; aerodynamic numerical methods.

4. The computer-aided method according to claim 1, wherein the aircraft performance target is one or a combination of the following: a total force on said mobile surface, a total moment on the aircraft, a side force on the aircraft, a reaction on the mobile surface joint or actuator.

5. The computer-aided method according to claim 1, characterized in that said mobile surface is one of the following: a horizontal tail plane, a canard, a tail, an elevator, an aileron, a flap, a slat, a rudder, a spoiler.

6. A system for designing aircraft mobile surfaces including calculating the position of said mobile surface as it moves through a fluid medium, which is affected by at least an upstream or downstream object component, for achieving a predetermined value Vo of a predetermined object performance target, wherein said system comprises:

a) a computer-implemented 3D discrete model of said object and the surrounding fluid;
b) a computer-implemented 3D computational fluid dynamics module for calculating said object performance target at different positions of said mobile surface;
c) tools for optimizing the iteration of the calculations of said performance target at different positions of said mobile surface to achieve a predetermined value of said object performance target; and
d) computer-aided design tools to apply the result of said calculation to design of an aircraft mobile surface.

7. The system according to claim 6, wherein the aircraft performance target is one or a combination of the following: a total force on said mobile surface, a total moment on the aircraft, a side force on the aircraft, a reaction on the mobile surface joint or actuator.

8. The system according to claim 6, wherein said mobile surface is one of the following: a horizontal tail plane, a canard, a tail, an elevator, an aileron, a flap, a slat, a rudder, a spoiler.

* * * * *